(12) United States Patent
Park et al.

(10) Patent No.: US 9,040,320 B2
(45) Date of Patent: May 26, 2015

(54) MANUFACTURING METHOD OF ORGANIC LIGHT EMITTING DISPLAY DEVICE

(71) Applicant: LG DISPLAY CO., LTD., Seoul (KR)

(72) Inventors: Jae Hyun Park, Seoul (KR); Jin Wuk Kim, Goyang-si (KR); Wy Yong Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/104,404

(22) Filed: Dec. 12, 2013

(65) Prior Publication Data

US 2014/0356992 A1  Dec. 4, 2014

(30) Foreign Application Priority Data

May 28, 2013  (KR) .................... 10-2013-0060296

(51) Int. Cl.
| | |
|---|---|
| *H01L 21/00* | (2006.01) |
| *H01L 51/56* | (2006.01) |
| *H01L 27/32* | (2006.01) |

(52) U.S. Cl.
CPC ............ *H01L 51/56* (2013.01); *H01L 27/3244* (2013.01)

(58) Field of Classification Search
CPC ......... H01L 51/00; H01L 51/50; H01L 51/56; H01L 51/5012; H01L 27/3225; H01L 27/3258; H01L 27/326

USPC ........... 438/23, 29, 34, 35; 430/322, 327, 330
See application file for complete search history.

(56) References Cited

U.S. PATENT DOCUMENTS

| | | | | |
|---|---|---|---|---|
| 7,932,113 | B1 * | 4/2011 | Yee et al. ......................... | 438/35 |
| 2003/0022111 | A1 * | 1/2003 | Falk et al. ...................... | 430/322 |
| 2005/0118362 | A1 * | 6/2005 | Kim et al. .................. | 428/32.81 |
| 2009/0302744 | A1 * | 12/2009 | Kim et al. ...................... | 313/504 |
| 2011/0003414 | A1 * | 1/2011 | Choi ............................... | 438/29 |
| 2012/0138936 | A1 * | 6/2012 | Lee et al. ......................... | 257/59 |

\* cited by examiner

*Primary Examiner* — Reema Patel
*Assistant Examiner* — Syed Gheyas
(74) *Attorney, Agent, or Firm* — Brinks Gilson & Lione

(57) ABSTRACT

A manufacturing method of an organic light emitting display device is disclosed which includes: forming a thin film transistor on each sub-pixel region which is defined in a substrate; forming a passivation layer on the substrate provided with the thin film transistor; forming a first electrode of an organic light emitting diode in each sub-pixel region of the passivation layer; forming a bank pattern in boundaries of the sub-pixel region of the passivation layer; forming a photoresist pattern, which exposes a first sub-pixel region, on the bank pattern; forming an organic light emission layer on the first electrode within the first sub-pixel region and an organic material layer on the photoresist pattern by depositing an organic material on the entire surface of the substrate provided with the photoresist pattern; and removing the photoresist pattern and the organic material pattern using a detachment film.

12 Claims, 3 Drawing Sheets

MANUFACTURING METHOD OF ORGANIC LIGHT EMITTING DISPLAY DEVICE

The present application claims priority under 35 U.S.C. §119(a) to Korean Patent Application No. 10-2013-0060296 filed on May 28, 2013, which is hereby incorporated by reference in its entirety.

BACKGROUND

1. Field of the Disclosure

The present application relates to a method of manufacturing an organic light emitting display device, and more particularly to a manufacturing method of an organic light emitting display device adapted to realize high definition and a larger size.

2. Description of the Related Art

The organic light emitting display devices are self-illuminating display devices. As such, the organic light emitting display devices do not need any separated light source which is used in a liquid crystal display device. In accordance therewith, the organic light emitting display devices can become lighter and thinner. Also, the organic light emitting display devices have the features of wider viewing angle, superior contrast, and lower power consumption than those of the liquid crystal display devices. Moreover, the organic light emitting display devices can be driven by a low direct-current voltage and provide a high speed response. Furthermore, the organic light emitting display devices can well resist external impacts and be used in a wide temperature range because of having solid components.

Such an organic light emitting display device includes two electrodes stacked on a substrate, and a light emission layer EML interposed between the two electrodes. The light emission layer EML is patterned using one of a fine metal mask method, an ink-jet method, a lift-off method and so on.

The fine metal mask method cannot be applied to a large-sized and high definition display device due to technical limitations of mask formation. More specifically, a large-sized mask droops due to its weight and forces a desired pattern to be not formed. Also, the spread of an organic material is aggravated due to a separate distance between its deposition portion and the mask. As such, it is difficult to realize high definition.

The ink-jet method jets a liquid material. As such, organic light emitting elements must be exposed while the process is being performed. Due to this, the performance of the organic light emitting element must deteriorate.

Other methods using the existing etch process enable a metal to be in direct contact with an etchant. Due to this, a disconnection fault can be generated. Also, it is difficult to control etch-depth. As such, properties of the organic light emitting element can deteriorate.

The lift-off method can form a fine pattern using only an exposure process and a development process without an etch process, unlike a photo mask procedure including the exposure, development and etch processes. When a photoresist pattern is removed, a residual film is caused by strong adhesion force of the photoresist and an organic light emission layer EML must be exposed to a solvent which is used to remove the photoresist pattern. As such, a fault of the organic light emission layer EML can be caused by the residual film and the solvent. Due to this, luminous properties of the organic light display device must deteriorate.

SUMMARY

A manufacturing method of an organic light emitting display device includes: forming a thin film transistor on each sub-pixel region which is defined in a substrate; forming a passivation layer on the substrate provided with the thin film transistor; forming a first electrode of an organic light emitting diode in each sub-pixel region of the passivation layer; forming a bank pattern in boundaries of the sub-pixel region of the passivation layer; forming a photoresist pattern, which exposes a first sub-pixel region, on the bank pattern; forming an organic light emission layer on the first electrode within the first sub-pixel region and an organic material layer on the photoresist pattern by depositing an organic material on the entire surface of the substrate provided with the photoresist pattern; and removing the photoresist pattern and the organic material pattern using a detachment film. The detachment film includes polymer clay and is disposed on the organic material pattern and formed to encompass side surfaces of the organic material pattern and the photoresist pattern.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1A:
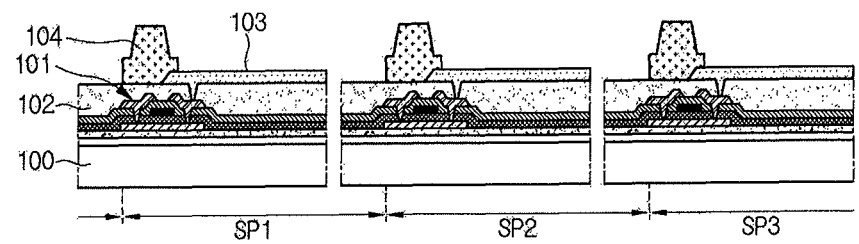
FIGS. 1A and 1F are cross-sectional views illustrating a method of manufacturing an organic light emitting display device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 1B:
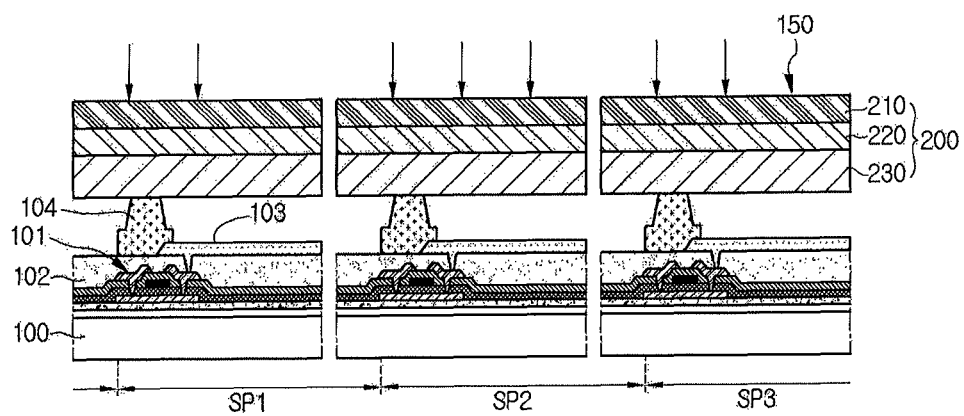
Figure 1C:
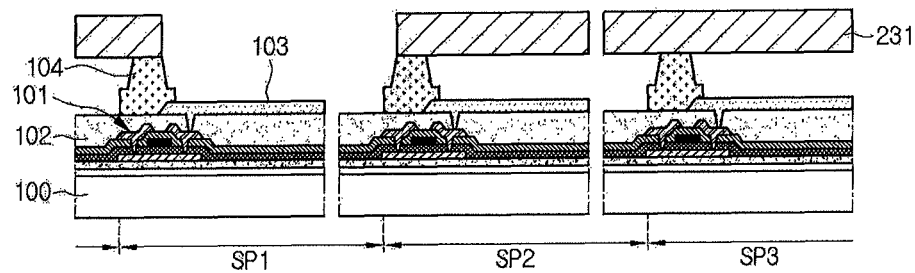
Figure 1D:
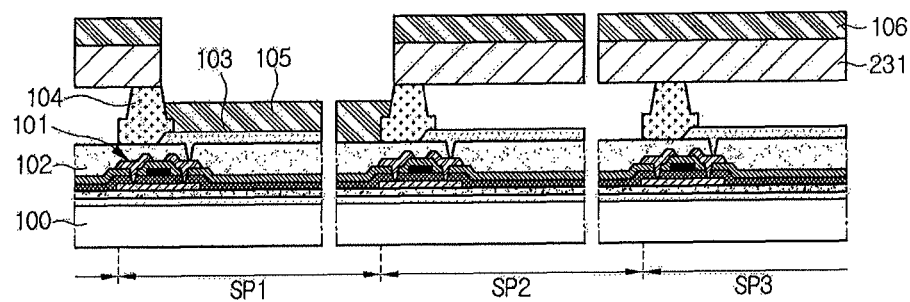
Figure 1E:
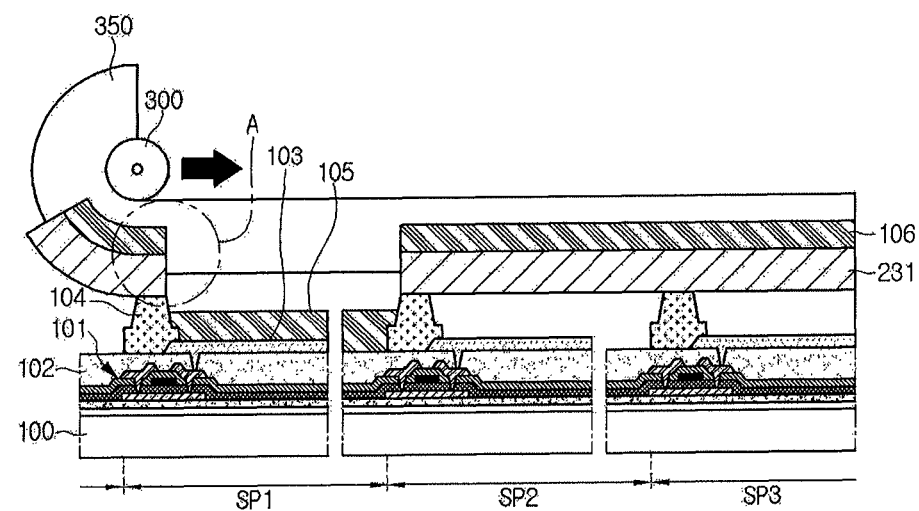
Figure 1F:
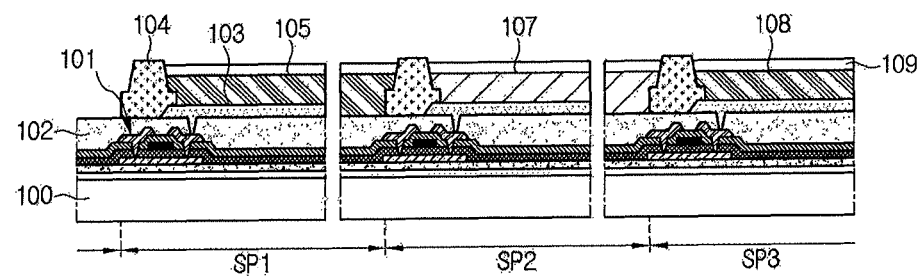

FIGS. 1A and 1F are cross-sectional views illustrating a method of manufacturing an organic light emitting display device according to an embodiment of the present disclosure.

Referring to FIG. 1A, the organic light emitting display device according to the present disclosure includes a substrate 100 on which gate lines and data lines are formed with having a gate insulation film therebetween. The gate lines and the data lines cross perpendicular to each other and define the substrate 100 into a plurality of sub-pixel regions SP1, SP2 and SP3. Also, the organic light emitting display device includes thin film transistors 101, a passivation layer 102, first electrodes 103 of organic light emitting diodes, and a bank pattern 104 which are formed on the substrate 100 provided with the gate lines and the data lines.

Each of the thin film transistors 101 is formed at an intersection of the gate and data lines in such a manner as to have a semiconductor layer, a gate electrode, a source electrode ad a drain electrode. Each of the thin film transistors 101 is electrically connected to the first electrode 103 of the respective organic light emitting diode via a contact hole, which is formed in the passivation layer 102. The thin film transistor 101 is not limited a shape shown in the drawings. In other words, the thin film transistor 101 can be formed in a variety of shapes. Moreover, a plurality of driving elements including a switching thin film transistor, a driving thin film transistor, a compensation circuit configured to compensate a threshold voltage of the driving thin film transistor can be formed in each of the sub-pixel regions SP. Such driving elements can be freely arranged within the sub-pixel region SP.

The first electrode 103 of the organic light emitting diode can become an anode electrode. Also, the first electrodes 103 of the organic light emitting diodes are formed on the passivation layer 102 corresponding to the sub-pixel regions SP1, SP2 and SP3 in such a manner as to be separate from one another. Furthermore, the first electrodes 103 of the organic light emitting diodes are in contact with the respective drain electrodes. Such first electrodes of the organic light emitting diodes can be formed in one of a transparent electrode and a reflective electrode, and from a variety of conductive materials. For example, when the first electrode 103 of the organic light emitting diode is the transparent electrode, the first electrode 103 of the organic light emitting diode can be formed from one of ITO (indium-tin-oxide), IZO (indium-zinc-oxide), ZnO and $In_2O_3$. On the other hand, if the first electrode of the organic light emitting diode is the reflective electrode, the first electrode can be configured with a reflective film, which is formed from one of silver Ag, magnesium Mg, aluminum Al, platinum Pt, lead Pb, gold Au, nickel Ni, neodymium Nd, iridium Ir, chrome Cr, and alloys thereof, and a transparent conductive film formed from one of ITO (indium-tin-oxide), IZO (indium-zinc-oxide), ZnO and $In_2O_3$. However, the first electrode 103 of the organic light emitting diode is not limited to the above-mentioned formation materials.

The bank pattern 104 is formed in such a manner as to expose a part of the first electrode 103 of each organic light emitting diode. More specifically, the bank pattern 104 can be formed to cover edges of the first electrodes 103 of the organic light emitting diodes. In other words, the bank pattern 104 can be formed in boundaries between the sub-pixel regions SP1, SP2 and SP3. An organic light emission layer will be formed on the first electrodes 103 of the organic light emitting diodes exposed by the bank pattern 104 later. Such a bank pattern 104 can be formed from an insulation material such as silicon oxide SiOx, silicon nitride SiNx or others. Alternatively, the bank pattern 104 can be formed from a variety of organic insulation materials.

Referring to FIGS. 1B and 1C, a photoresist film 200 is laminated on the bank pattern 104. The photoresist film 200 is patterned into a photoresist pattern 231 by being exposed laser light 150.

More specifically, the photoresist film 200 is disposed and uniformly laminated in such a manner as to face the upper surface of the bank pattern 104 formed on the passivation layer 102. The photoresist film 200 must be uniformly laminated without sagging in openings, which are formed by the bank pattern 104. Although it is not shown in the drawings, an auxiliary bank layer can be formed between the bank pattern 104 (in detail, in the openings which are formed by the bank pattern 104. The auxiliary bank layer enables the photoresist film 200 to be more uniformly laminated.

Thereafter, laser light 150 is irradiated on the rest regions of the photoresist film 200 with exception of the first sub-pixel regions SP1. The laser light can have an infrared wavelength. In other words, laser light 150 with an infrared wavelength of at least 1000 nm can be irradiated onto irradiation regions of the photoresist film 200 using a scan mode or an additional mask. The irradiation of infrared light can be designed by adjusting wavelength and irradiation time based on fixed energy density. Alternatively, the irradiation of infrared light can be designed by controlling the energy density and the irradiation time based on a fixed wavelength band of at least 1000 nm.

The photoresist film 200 can include a supporting layer 210, a photo expansion layer 220 and a photoresist composition layer 230. Alternatively, the photoresist film 200 can further include a middle layer interposed between the photo expansion layer 220 and the photoresist composition layer 230. The middle layer can prevent pollution of the photoresist composition layer 230 and allow the photoresist composition layer 230 to be easily attached to and detached from.

The supporting layer 210 can protect and support the photo expansion layer 220 and the photoresist composition layer 230. Also, the supporting layer 210 can be formed from one of glass, a transparent film and a high polymer film which each have a high transmittance. Preferably, the supporting layer 210 is formed from a polyester-based film. For example, the supporting layer 210 can become one of a polyethylene terephthalate (PET) film and a polyethylene naphthalate (PEN) film. However, the supporting layer 210 is not limited to the above-mentioned formation materials. In other words, the supporting layer 210 can be formed from a variety of materials.

The photo expansion layer 220 selectively absorbs only light with an infrared wavelength band and converts the absorbed light into thermal energy. Also, the photo expansion layer 220 expands with the converted thermal energy. As such, the photo expansion layer 220 can be formed from a material with superior photo absorptivity and high photothermal energy conversion efficiency. For example, the photo expansion layer 220 can be formed from one of carbon black, graphite pigment, an organic compound such as an infrared dyn, a metal such as aluminum Al, tin Sn, titanium Ti, an oxide thereof, and an compound of thereof.

The photoresist composition layer 230 includes an UV curable resin and a variety of additives. As such, the photoresist composition layer 230 has superior contractibility. The UV curable resin included in the photoresist composition layer 230 can be formed from an organic compound with one of an acrylic radical or a vinyl radical. For example, the UV curable resin can be formed from one of poly methyl methacrylate (PMMA), butyl methacrylate BMA, urethane acrylate and poly vinyl alcohol.

The additives included in the photoresist composition layer 230 can include light initiator and photo-acid generator. Also, the additives can further include binder or monomer including the binder.

The light initiator hardens the binder when light is irradiated. As such, the light initiator can be used to enhance the hardness of the photoresist film 200. For example, the light initiator can include one of acetophenone, benzophenone, oxime and so on. A kind of the light initiator or content thereof depends on a shape of a desired pattern or the wavelength band of light used in the exposure process.

The photo-acid generator can generate acid when light is irradiated. For example, the photo-acid generator can include one of triarylsulfonium, diaryliodonium salts, sulfonates and mixtures thereof.

The binder can serve as a cross linking agent when light is irradiated. For example, the binder can include novolak, polyester acrylate, epoxy acrylate, urethane acrylate, or others. However, the photoresist composition layer 230 is not limited to the above-mentioned materials. In other words, the photoresist composition layer 230 can be formed from a variety of materials.

The photoresist film 200 is regionally volume-expanded and interlayer-separated only in a region to which laser light 150 is irradiated. More specifically, a part of the photo expansion layer 220 exposed to laser light 150 volume-expands, and then a part of the photoresist composition layer 230 corresponding to the expanded portion of the photo expansion layer 220 is separated from the photo expansion layer 220. On the other hand, the photo expansion layer 220 and the photoresist composition layer 230 are not interlayer-separated from each other in the other region (i.e., the first sub-pixel region SP1) not exposed to laser light 150. In other words, the interlayer separation is generated only in a region of the photoresist film 200 exposed to laser light 150. As such, a photoresist pattern 231 remains only in the region exposed to laser light 150 by removing the interlayer-separated photo expansion layer 220.

In this way, the photoresist pattern 231 forming an opening in the first sub-pixel region SP1 can be formed as shown in the drawings. As such, an organic light emission layer can be deposited on the first electrode 103 of the organic light emitting diode within the first sub-pixel region SP1. Although it is not shown in the drawings, another photoresist pattern forming another opening in the second sub-pixel region SP2, or still another photoresist pattern forming still another opening in the third sub-pixel region SP3 can be selectively formed on the bank pattern 104 instead of the above-mentioned photoresist pattern 231.

The photoresist pattern 231 can be formed through adjustment of a temperature together with the irradiation of infrared laser light. An additional process such as adjustment of a temperature can be selectively applied according to properties of the photoresist film 200.

Referring to FIG. 1D, an organic material layer 105 and 106 are formed on the entire surface of the substrate 100 provided with the photoresist pattern 231. The organic material layer 105 and 106 can include an organic light emission layer 105 and an organic material pattern 106. The organic light emission layer 105 including a red light emission material is formed on the first electrode 103 of the organic light emitting diode (i.e., within the first sub-pixel region SP1), which is exposed by the photoresist pattern 231. On the other hand, the organic material pattern 106 is formed on the photoresist pattern 231, which occupies the rest regions of the substrate 100 with exception of the first sub-pixel region SP1. In other words, the organic light emission layer 105 and the organic material pattern 106 are formed from the same material, but disposed in different positions from each other. Also, in succeeding processes, not only another organic light emission layer including a green light emission material can be deposited on the first electrode 103 of the organic light emitting diode within the second sub-pixel region SP2, but also still another organic light emission layer including a blue light emission material can be deposited on the first electrode 103 of the organic light emitting diode within the third sub-pixel region SP3, as shown in FIG. 1F.

The organic light emission layer 105 can become a single layer formed from a light emission material. Alternatively, in order to enhance luminous-efficiency, the organic light emission layer 105 can be configured with multiple layers which includes a hole injection layer, a hole transportation layer, a light emission material layer, an electron transportation layer and an electron injection layer.

The hole injection layer enables holes to be smoothly injected from the first electrode 103 of the organic light emitting diode to the light emission material layer. Such a hole injection layer can be formed from one of CuPc (cupper phthalocyanine), PEDOT (poly(3,4)-ethylenediox-ythiophene), PANI (polyaniline) and NPD (N,Ndinaphthy-N, N'-diphenyl benzidine), but it is not limited to this.

The hole transportation layer is used to enhance luminous-efficiency by easily transporting the holes to the light emission material layer and by suppressing the movement of electrons, which are generated in a cathode electrode, to a light emission region. In other words, the hole transportation layer is used to smoothly transport the holes. Such a hole transportation layer can be formed from one of NPD (N,N-dinaphthyl-N,N'-diphenyl benzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine), but it is not limited to this.

The light emission material layer can include a host material and a dopant. Also, the light emission material layer can be formed from a light emission material emitting one of red light, green light, blue light and white light. The light emission material can become one of a phosphorescent material and a fluorescent material. As such, a variety of light emission materials can be used to form the light emission material layer.

The electron transportation layer enables electrons to be easily transported. Such an electron transportation layer can be formed from one of Alq3 (tris(8-hydroxyquinolino)aluminum), PBD, TAZ, spiro-PBD, BAlq and SAlq, but it is not limited to this.

The electron injection layer enables the electrons to be smoothly injected. Such an electron injection layer can be formed from one of Alq3 (tris(8-hydroxyquinolino)aluminum), PBD, TAZ, LiF, spiro-PBD, BAlq and SAlq, but it is not limited to this.

The red light emission material included in the organic light emission layer 105 can become one of a phosphorous material and a fluorescent material. The phosphorous material can include a host material, which includes one of CBP (carbazole biphenyl) and mCP (1,3-bis(carbazol-9-yl), and a dopant including at least one selected from a group which consists of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum). The fluorescent material can include one of PBD:Eu(DBM)3(Phen) and perylene. However, the present disclosure is not limited to these.

The green light emission material included in the organic light emission layer which is formed in the second sub-pixel region SP2 can become one of a phosphorous material and a fluorescent material. The phosphorous material can include a host material, which includes one of CBP and mCP, and a dopant including Ir(ppy)3(fac tris(2-phenylpyridine)iridium). The fluorescent material can include alq3(tris(8-hydroxyquinolino)aluminum). However, the present disclosure is not limited to these.

The blue light emission material included in the organic light emission layer which is formed in the third sub-pixel region SP3 can become one of a phosphorous material and a fluorescent material. The phosphorous material can include a host material, which includes one of CBP and mCP, and a dopant including one of (4,5-F2ppy)2Irpic and L2BD111. The fluorescent material can include one selected from a group which consists of spiro-BPVBi, spiro-6P, distyrylbenzene (DSB), distyrylarylene (DSA), a PFO-based high polymer and a PPV-based high polymer. However, the present disclosure is not limited to these.

For example, the organic red-light emission layer 105 can be formed from red light emission materials which include a low polymer material, such as Alq3(host material)/DCJTB (fluorescent dopant), Alq3(host material)/DCM(fluorescent dopant), CBP(host material)/PtOEP(phosphorous organic metal complex) or others, and a high polymer material such as a PFO-based high polymer, a PPV-based high polymer or others. The organic green-light emission layer can be formed from green light emission materials which include a low polymer material, such as Alq3, Alq3(host material)/C545t (dopant), CBP(host material)/IrPPY(phosphorous organic material complex) or others, and a high polymer material such as a PFO-based high polymer, a PPV-based high polymer or others. The organic blue-light emission layer can be formed from blue light emission materials which include a low polymer material, such as DPVBi, spiro-DPVBi, spiro-6P, distyrylbenzene (DSB), distyrylarylene (DSA) or others, and a high polymer material such as a PFO-based high polymer, a PPV-based high polymer or others.

As shown in FIG. 1E, the photoresist pattern 231 provided with the organic material pattern 106 is removed from the substrate 100 using a detachment film 350 and a detachment roller 300. At this time, the photoresist pattern 231 can be hardened by being exposed to ultra-violet rays, in order to reduce cohesion force between the photoresist pattern 231 and the bank pattern 104. The reduced cohesion force between the photoresist pattern 231 and the bank pattern 104 enables the photoresist pattern 231 to be easily detached from the bank pattern 104 by the detachment film 350.

The organic material pattern 106 and the photoresist pattern 231 can be removed from the bank pattern 104 by positioning the detachment roller 300 wound with the detachment film 350 on the photoresist pattern 231 and the organic material pattern 106 and rotating the detachment roller 300 in a rotation direction. The detachment film 350 winding round the detachment roller 300 will now be described with reference to FIGS. 2 and 3.

Figure 2:
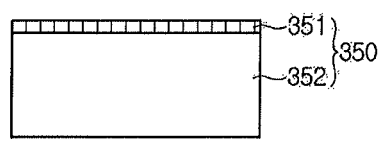
FIG. 2 is a cross-sectional view showing a detachment film according to an embodiment of the present disclosure.
Figure 3:
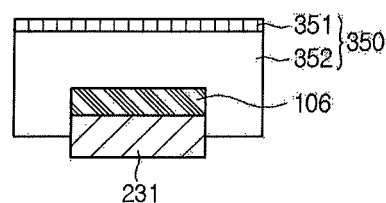
FIG. 3 is a cross-sectional view illustrating a separation process using the detachment film of FIG. 2.

FIG. 2 is a cross-sectional view showing a detachment film according to an embodiment of the present disclosure. FIG. 3 is a cross-sectional view illustrating a separating process using the detachment film of FIG. 2.

Referring to FIG. 2, the detachment film 350 includes a support layer 351 and an adhesive layer 352. The support layer 351 can become a base film configured to support the adhesive layer 352. The adhesive layer 352 is formed from an adhesion material suitable to separate the photoresist pattern 231 together with the organic material pattern 106. If the adhesive layer 352 does not have desired strength, thickness, flexibility, elasticity and so on, foreign substances including residual of the photoresist pattern 231 and fine dusts can be generated due to partial removal of the photoresist pattern 231 is removed. Due to this, the quality of the organic light emitting display device can deteriorate. To address this matter, the separating process can be performed several times. In this case, production efficiency deteriorates due to the increment of process time.

Therefore, the present disclosure is to provide a detachment film 350 adapted to enhance efficiency of the separating process and prevent the generation of foreign substances.

FIG. 3 is a cross-sectional view showing a side surface of a region A in FIG. 1E, and illustrating the separating process. The detachment film 350 disclosed in the present disclosure can come in contact with an upper surface of the organic material pattern 106 to be separated and side surfaces of the organic material pattern 106 and the photoresist pattern 231. In other words, in order to overcome a limitation that the detachment film 350 comes in contact with only the upper surface of a pattern to be separated, the detachment film is formed to have enough adhesion area to contact all the materials which will be removed. To this end, a capping effect is applied to the detachment film 350. The capping effect means a technique encompassing side surfaces of a material layer.

$$k = \frac{AE}{L} \quad \text{[Equation 1]}$$

In the equation 1, "k" is stiffness of a cohesive material layer, "A" is a cross-sectional area of a cohesive material layer, "E" is Young's modulus, and "L" is length of the cohesive material layer. As the stiffness become higher, it is difficult to apply the capping effect. In other words, Young's modulus must be reduced in order to lower the stiffness. In accordance therewith, the detachment film 350 can be formed enough to encompass the upper surface of the organic material pattern 106 and the side surfaces of the organic material pattern 106 and the photoresist pattern 231.

In order to reduce Young's modulus, the adhesive layer 352 of the detachment film 350 can include polymer clay and an elastomer material. The adhesive layer 352 of the detachment film 350 further includes a tackifier in order to increase adhesion force. Moreover, in order to increase the adhesion force, hardening condition and density of the adhesive layer 352 can be adjusted. Preferably, a hardening reaction comes to an end before non-reacted cross-linkable functional-groups are entirely used. To this end, the degree of hardening can be controlled not less than 17% but no more than 85%. In other words, the non-reacted cross-linkable functional-groups can remain by lowering hardening density thereby reducing Young's modulus. Also, when a contact area is widened, the non-reacted cross-linkable functional-groups together with the tackifier can enhance the adhesion force.

The detachment film 350 can be formed from a material with properties of being easy to lengthen but not snapped. In other words, the detachment film 350 can be formed from a mixture of at least two materials. Also, the adhesive layer 352 of the detachment film 350 can be formed in a thickness range of about 2 μm-200 μm, in order to encompass the organic material pattern 106 and the photoresist pattern 231 which will be removed.

The polymer clay can include a polyvinyl-based material and a urethane-based material as a main material. For example, the polymer clay can include one of PVC, PS, PE, PP, PVA, PMMA, PVAc and so on. However, materials belonging to the polymer clay can be used in the formation of the adhesive layer 352. As such, the present disclosure is not limited to this. Also, the polymer clay can include a foaming agent. The foaming agent can increase the distance between backbones of the polymers and induce Young's modulus to deteriorate. The polymer clay can further include a phthalate-based additive, in order to enhance pliability.

The elastomer can include one selected from a group which consists of chlorosulfonated polyethylene, copolyester TPE, epichlorohydrin rubber, epoxy resin, ethylene acrylic rubber, ethylene propylene rubber, ethylene-vinyl acetate copolymer, fluorocarbon rubber, fluorosilicone rubber, halogenated butyl rubber, hydrogenated nitrile rubber, melt processible rubber, natural rubber, neoprene rubber, nitrile rubber, polyether block amide, polyacrylate rubber, polyisoprene rubber, polyolefin elastomers, poly(propylene oxide) rubber, polysulfide rubber, silicone-modified EPDM, silicone rubber styrene-butadiene rubber, Styrenic TPE and combinations thereof, as an example. However, all materials belonging to the elastomer can be used in the formation of the adhesive layer 352. As such, the present disclosure is not limited to this.

The tackifier can become one of a cumarone inden resin, a Iodine-based resin, a terpene-based resin, a phenol-based resin and so on. Preferably, the tackifier includes one of formaldehyde, acetal and a combination thereof. However, all materials belonging to the tackifier can be used in the formation of the adhesive layer 352. As such, the present disclosure is not limited to this.

Figure 4:
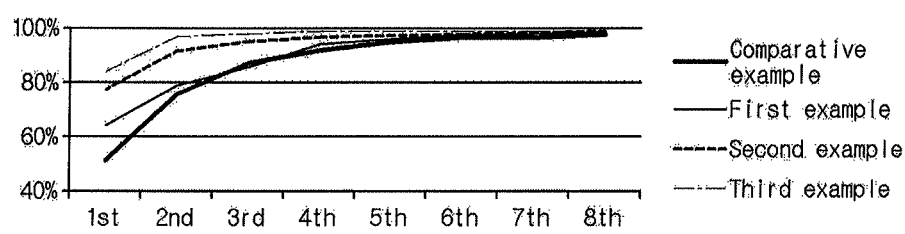
FIG. 4 is a data sheet illustrating effects of detachment films according to an embodiment of the present disclosure.

Examples of the detachment film according to the present disclosure can obtain effects as shown in FIG. 4.

FIG. 4 is a data sheet illustrating effects of detachment films according to the present disclosure.

The detachment film according to the present disclosure can be embodied or modified in a variety of modes. As such, the scope of the detachment film 350 must not be limited to the following examples.

First Through Third Examples

First through third examples of the adhesive layer 352 of the detachment film 350 can be formed from compositions described in the following table 1. The adhesive layers 352 according to the first through third examples are formed in a thickness of 2 μm.

TABLE 1

|  | Polymer clay | Formaldehyde | Acetal | Epoxy resin | Degree of hardening |
|---|---|---|---|---|---|
| 1st example | 40~90 wt % | 10~42 wt % | 8~37 wt % | | |
| 2nd example | 40~90 wt % | 10~42 wt % | 8~37 wt % | 2~8 wt % | |
| 3rd example | 40~90 wt % | 10~42 wt % | 8~37 wt % | 2~8 wt % | 17~85% |

Comparative Example

A comparative example of the adhesive layer 352 of the detachment film 350 is formed from 100 weight % of acryl. Also, the adhesive layer 352 of the detachment film 350 is formed in the same thickness as those of the first through third examples.

TABLE 2

| | Separation process | | | | | | | |
|---|---|---|---|---|---|---|---|---|
| | 1st time | 2nd time | 3rd time | 4th time | 5th time | 6th time | 7th time | 8th time |
| Comparative example | 52% | 76% | 87% | 92% | 95% | 97% | 97% | 98% |
| 1st example | 64% | 79% | 86% | 94% | 96% | 98% | 98% | 99% |
| 2nd example | 78% | 92% | 95% | 97% | 98% | 98% | 99% | 99% |
| 3rd example | 84% | 97% | 98% | 99% | 99% | 99% | 99% | 99% |

Referring to table 1 and FIG. 4, removal rates of the photoresist pattern 231 by the comparative example and the first through third examples of the detachment film 350 will now be described. The removal rates are obtained in percentage of a removed area with respect to a transcribed area. The comparative example of the detachment film including the adhesive layer formed from 100 weight % of acryl, can obtain only a removal rate of 98% even though the separation process is performed eight times. On the other hand, the first example of the detachment film including the adhesive layer formed from polymer clay, formaldehyde, and acetal provides a removal rate of 98% through only six times of the separation processes, and a removal rate of 99% through eight times of the separation processes. Also, the second example of the detachment film including the adhesive layer formed from polymer clay, formaldehyde, acetal and an epoxy resin represents a removal rate of 98% through five times of the separation processes, and a removal rate of 99% through six times of the separation processes. Moreover, the third example of the detachment film including the adhesive layer, which is formed from polymer clay, formaldehyde, acetal and an epoxy resin and hardened in about 17-85%, represents a removal rate of 84% through only one time of the separation process, and a removal rate of 99% through four times of the separation processes.

Therefore, it is evident that the detachment films according to the first through third examples provide superior effects compared to that of the comparative example. In other words, when the photoresist pattern 231 and the organic material pattern 106 thereon are removed by the detachment film in accordance with the present disclosure, the generation of foreign substances including residuals and dust can be prevented or minimized. As such, quality deterioration of the organic light emitting display device can be prevented, and process efficiency can be enhanced.

As shown in FIG. 1F, different organic light emission layers 105, 107 and 108 from one another can be formed on the sub-pixel regions SP1, SP2 and SP3 by repeatedly performing the processes illustrated in FIGS. 1B through 1E. More specifically, the organic red-light emission layer 105 including the red light emission material can be deposited on the first sub-pixel region SP1, the organic green-light emission layer 107 including the green light emission material can be deposited on the second sub-pixel region SP2, and the organic blue-light emission layer 108 including the blue light emission material can be deposited on the third sub-pixel region SP3.

Each of the organic light emission layers 105, 107 and 108 can be formed in a single layer. Alternatively, in order to enhance luminous-efficiency, each of the organic light emission layers 105, 107 and 108 can be formed in a multi-layer structure which includes a hole injection layer, a hole transportation layer, a light emission material layer, an electron transportation layer and an electron injection layer.

Subsequently, a second electrode 109 of the organic light emitting diode is formed on the upper surface of the substrate 100 provided with the organic light emission layers 105, 107 and 108. The second electrode 109 of the organic light emitting diode can become a cathode electrode. Also, the second electrode 109 of the organic light emitting diode can become one of a transparent electrode and a reflective electrode. If the second electrode 109 of the organic light emitting diode is the transparent electrode, the second electrode 109 of the organic light emitting diode can include a main electrode layer formed from one of Li, Ca, LiF/Ca, LiF/Al, Al, Mg and alloys thereof, and a sub-electrode layer or a bus electrode line formed from one of ITO (indium-tin-oxide), IZO (indium-zinc-oxide), ZnO, $In_2O_3$ and so on. The sub-electrode layer or the bus electrode line can be formed on the main electrode layer. On the other hand, when the second electrode 109 of the organic light emitting diode is the reflective electrode, the second electrode 109 can be formed from one of Li, Ca, LiF/Ca, LiF/Al, Al, Mg and alloys thereof. However, the material forming the second electrode 109 of the organic light emitting diode is not limited to these.

If a voltage in accordance with a selected chromatic signal is applied between the first and second electrodes 103 and 109 of the organic light emitting diode which are included in the organic light emitting display device, holes and electrons are transferred to the organic light emission layer 105, 107 or 108 form excitons. Then, the organic light emitting display device can emit visible light which is generated by transition of the excitons from a excitation state to a base state. The emitted light is applied to the exterior via the transparent electrode of the organic light emitting display device. In accordance therewith, an image can be displayed.

Thereafter, an encapsulation process can be performed for the above-mentioned substrate 100 provided with the organic light emitting diodes, in order to externally protect the organic light emitting diode in each of sub-pixel regions SP1, SP2 and SP3. In detail, a thin film encapsulation method can be used in the manufacture of the organic light emitting display device. Such a thin film encapsulation method is well known to an ordinarily skilled person. As such, the detailed description of the thin film encapsulation method will be omitted in the present disclosure.

Such a manufacturing method of the organic light emitting display device according to the present disclosure can realize high definition and a large size. Also, the manufacturing method of the organic light emitting display device can enhance luminous properties of the display device and extend a life span of the display device. Moreover, the manufacturing method of the organic light emitting display device can be easy to manufacture the display device and enhance productivity of the display device.

In detail, the improved detachment film according to the present disclosure enables foreign substances not to remain on the substrate at the removal of the photoresist pattern and the organic material layer thereon. As such, quality deterioration of the organic light emitting display device can be prevented, and process efficiency can be enhanced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A method of manufacturing an organic light emitting display device, the method comprising:
   forming a thin film transistor on each sub-pixel region which is defined in a substrate;
   forming a passivation layer on the substrate with the thin film transistor formed thereon;
   forming a first electrode of an organic light emitting diode in each sub-pixel region of the passivation layer;
   forming a bank pattern in boundaries of the sub-pixel region of the passivation layer;
   forming a photoresist pattern, which exposes a first sub-pixel region, on the bank pattern;
   forming an organic light emission layer on the first electrode within the first sub-pixel region and an organic material layer on the photoresist pattern by depositing an organic material on the entire surface of the substrate with the photoresist pattern; and
   removing the photoresist pattern and the organic material pattern using a detachment film,
   wherein the detachment film includes polymer clay and is disposed on the organic material pattern and formed to encompass side surfaces of the organic material pattern and the photoresist pattern.

2. The method of claim 1, wherein the detachment film further includes an elastomer.

3. The method of claim 1, wherein the detachment film further includes a tackifier.

4. The method of claim 1, wherein the polymer clay includes a foaming agent.

5. The method of claim 1, wherein the polymer clay includes a phthalate-based additive.

6. The method of claim 1, wherein the detachment film includes a support layer and an adhesive layer.

7. The method of claim 6, wherein the adhesive layer of the detachment film is hardened in a range of 17%~85%.

8. The method of claim 1, wherein the detachment film is formed in a thickness range of 2 μm~200 μm.

9. The method of claim 1, wherein the detachment film is wound round a detachment roller, and the separation of the photoresist pattern and the organic material pattern includes:
   disposing the detachment roller wound with the detachment film;
   bringing the detachment film in contact with an upper surface of the organic material pattern and the side surfaces of the organic material pattern and the photoresist pattern; and
   removing the photoresist pattern and the organic material pattern by rotating the detachment roller.

10. The method of claim 1, further comprising hardening the photoresist pattern by irradiating ultra-violet rays to the photoresist pattern before the photoresist pattern and the organic material pattern is removed using the detachment film.

11. The method of claim 1, wherein the formation of the photoresist pattern includes:
   laminating a first photoresist film on the bank pattern; and
   irradiating laser light to the rest regions of the photoresist film with the exception of the first sub-pixel region; and
   removing the first photoresist film from the bank pattern with the exception of the photoresist pattern.

12. The method of claim 1, wherein first photoresist film includes:
   a photoresist composition layer coming in contact with the bank pattern;
   a photo expansion layer formed on the photoresist composition layer; and
   a support layer formed on the photo expansion layer.

* * * * *